United States Patent [19]

Uomi et al.

[11] Patent Number: 4,873,691
[45] Date of Patent: Oct. 10, 1989

[54] WAVELENGTH-TUNABLE SEMICONDUCTOR LASER

[75] Inventors: Kazuhisa Uomi, Hachioji, Japan; Shinji Tsuji, Red Bank, N.J.; Shinji Sakano, Hachioji, Japan; Makoto Okai, Koganei, Japan; Naoki Chinone, Chofu, all of Japan

[73] Assignee: Hitachi, Ltd., Tokyo, Japan

[21] Appl. No.: 224,726

[22] Filed: Jul. 27, 1988

[30] Foreign Application Priority Data

Jul. 31, 1987 [JP] Japan .................................. 62-190040

[51] Int. Cl.⁴ .............................................. H01E 3/19
[52] U.S. Cl. ........................................ 372/20; 372/45; 372/50; 372/96
[58] Field of Search ................... 372/20.26, 45, 46, 50, 372/96

[56] References Cited

PUBLICATIONS

Murata, et al., "Spectral Characteristics of 1.5 um DBR DC-PBH Laser with Frequency Tuning Region", in *IEEE Semiconductor Laser Conference B-3* (1983), pp. 20-21.

Primary Examiner—James W. Davie
Attorney, Agent, or Firm—Antonelli, Terry & Wands

[57] ABSTRACT

A wavelength-tunable semiconductor laser having an active part and an external waveguide part is disclosed. The external waveguide part has a diffraction grating, such as a distributed Bragg reflector, and a quantum well structure optically coupled to the diffraction grating, together with electrodes for impressing an electric field to the quantum well structure. By applying the electric filed to the quantum well structure, the refractive index in the optically coupled diffraction grating/quantum well structure, and light oscillation wavelength in the external waveguide part, can be varied.

21 Claims, 4 Drawing Sheets

WAVELENGTH-TUNABLE SEMICONDUCTOR LASER

BACKGROUND OF THE INVENTION

The present invention relates to a wavelength-tunable semiconductor laser, particularly a wavelength-tunable semiconductor laser having an active part and an external waveguide part, the external waveguide part including a diffraction grating such as a distributed Bragg reflector (DBR). Such wavelength-tunable semiconductors have utility in known optical transmission systems, such as known coherent optical communication systems. Such a wavelength tunable semiconductor laser is used suitably as a laser for the local oscillation light source on the reception side of such coherent optical communication system.

A known wavelength-tunable semiconductor laser, having such active and external waveguide parts, is described in the article by Murata et al, "Spectral Characteristics of 1.5 μm DBR DC-PBH Laser With Frequency Tuning Region", from IEEE Semiconductor Laser Conference B-3 (1983). This article discloses frequency tunable (wavelength-tunable) single longitudinal mode semiconductor lasers, wherein tuning is performed by injecting current into a distributed Bragg reflector (DBR) region of the external waveguide part, the current injection reducing the refractive index of the DBR and changing the Bragg wavelength. This article discloses that wide continuous frequency tuning with stable spectral linewidth oscillation can be obtained.

The specific structure of the semiconductor laser disclosed in Murata et al includes two current injection regions, an active region and a DBR (external waveguide) region, the composition and thickness of the waveguide layers being the same for both regions. This article further discloses that between the active and waveguide layers is formed an InP buffer layer in order to remove the active layer in the DBR selectively by preferential etchant. This article discloses that the active and DBR regions were isolated electrically by a 20 μm wide etched groove which was formed on both sides of the center stripe area of the device.

This conventional semiconductor laser, described in the Murata et al. article, utilizes injection of a current to the external waveguide (DBR) region to change a carrier density of the waveguide, so as to change the refractive index of the external waveguide and thereby change the Bragg reflection wavelength of the diffraction grating to make the oscillation wavelength variable.

While this article discloses a wavelength-tunable semiconductor laser, some problems still remain in the operation of this device. Since current injection is used to vary the refractive index of the external waveguide to make the oscillation wavelength variable, this conventional structure can only modify the refractive index, and oscillation wavelength, a relatively small amount. For example, the change of the refractive index relative to the current injection quantity is at most about $3 \times 10^{-3}$, and the wavelength change (at a wavelength of 1.5 μm) by current injection is as small as about 10 Å.

Moreover, since this conventional structure uses current injection quantity (or, in other words, the change in carrier density) to change the refractive index of the external waveguide and vary the oscillation wavelength, the switching time of the device (that is, the time to change the refractive index), which is determined by the lifetime of the carriers, is as low as a few (e.g., three) nsec.

Thus, while the semiconductor laser disclosed in the article by Murata et al, can be utilized to vary the wwavelength of light emitted from the active layer of the semiconductor laser, problems still remain, with respect to increasing the range of variation of wavelength and improving switching time for varying the wavelength.

SUMMARY OF THE INVENTION

Accordingly, it is an object of the present invention to provide a wavelength-tunable semiconductor laser, utilizing an active part and an external waveguide part, the external waveguide part having a diffraction grating such as a distributed Bragg reflector (DBR) for modulating wavelength of light emitted from an active layer of the active part, the laser having an increased range of refractive index in the external waveguide part with corresponding increased variable range of the oscillation wavelength.

It is a further object of the present invention to provide a wavelength-tunable semiconductor laser, having an active part and external waveguide part, the external waveguide part including a diffraction grating such as a distributed Bragg reflector, achieving single longitudinal mode oscillation, which can improve the switching time for changing the wavelength.

These and other objects are obtained with the wavelength-tunable semiconductor laser of the present invention, wherein the diffraction grating (such as a distributed Bragg reflector) of the external waveguide part (e.g., DBR part) is optically coupled to a quantum well structure (for example, a multiple quantum well structure) in the external waveguide part, with means for applying an electric field to the quantum well structure. By applying an electric field to the quantum well structure, the refractive index thereof is changed; due to optical coupling of the quantum well structure and diffraction grating, the change in the refractive index of the quantum well structure causes change in the refractive index of the optically coupled diffraction grating/quantum well structure, and thereby a variation in oscillation wavelength of light in the external waveguide part.

Utilizing the fact that refractive index of a quantum well structure can be increased a great amount (about $10^{-2}$) to rays of light near the quantum level energy when an electric field is applied to a quantum well structure, applicants have applied such fact to provide a quantum well structure optically coupled to the diffraction grating of an external waveguide part of a semiconductor laser, to achieve the present invention.

By the present invention, wherein the application of an electric field to the quantum well structure optically coupled to the diffraction grating causes change in the refractive index of the quantum well structure (and a change in refractive index of the optically coupled diffraction grating/quantum well structure so as to cause variation in oscillation wavelength of light in the external waveguide part, there is no need to inject carriers into the diffraction grating of the external waveguide part (that is, there is no need to use the change of carrier density) to achieve the necessary change in refractive index. Since the switching speed in the present invention is determined essentially by the time constant of the circuit utilized for applying the electric field, the present invention can remarkably improve the switching speed. Moreover, since the change in refractive index is due to change in refractive index of the quantum well structure caused by application of the electric field, rather than by change in the carrier density, the range of variation in refractive index (and corresponding range of variation in oscillation wavelength) can be increased far more than with the current injection-type laser.

An important aspect of the present invention is that the quantum well structure and the diffraction grating of the external region are optically coupled. By optical coupling, it is meant that the light emitted from the active part extends, in the external waveguide part, in both the diffraction grating and the quantum well structure. Such optical coupling can be achieved by providing the quantum well structure relatively close, even directly adjacent, to the diffraction grating in the external waveguide part. Generally, the diffraction grating and quantum well structure should be sufficiently optically coupled such that a change in refractive index in the quantum well structure, caused by application of an electric field thereto, provides sufficient change in refractive index in the external waveguide part. Preferably, the thickness of the spacing between the diffraction grating and the quantum well structure should be smaller than the light oscillation wavelength without any electric field applied to the external waveguide part.

Thus, utilizing a quantum well structure optically coupled to the diffraction grating, a change in the refractive index of the quantum well structure (for example, by applying an electrical field across such quantum well structure) changes the refractive index of the diffraction grating/quantum well structure, in combination, so that the wavelength of light passing in the external waveguide part can be varied.

According to a preferred form of the present invention, the Bragg wavelength of the diffraction grating (for example, a DBR) of the external waveguide part, when no electric field is applied, is within 100 Å (that is, ±100 Å) of the wavelength corresponding to the quantum level energy of the lowest order of transition of electron and positive hole when no electric field is applied to the quantum well structure. Thus, preferably such Bragg wavelength (without application of electric field) is made to correspond to (that is, is made to be substantially equal to, or at least within 100 Å of) the quantum level energy of the lowest order of transition of electron and heavy positive hole of the quantum well layer when no field is applied to the quantum well structure.

The reason for this preferred structure is shown in the following. When a field is applied to a quantum well layer disposed in an external waveguide part, the refractive index of such well layer changes greatly near the quantum level energy. This results from the fact that the state of an exciton consisting of an electron and positive hole entrapped in the quantum well layer is extremely sensitive to the field. Moreover, when the quantum level energy of the lowest order of transition of electron and positive hole when no electric field is applied to the quantum well structure is used, optical absorption of the quantum well layer itself drops and it is extremely effective for use as part of the external waveguide part, optically coupled to a diffraction grating thereof. Thus, if the Bragg wavelength of the diffraction grating is set near the wavelength corresponding to the transition energy between the excitons of the electrons and the positive hole of the lowest level for the quantum well structure, the oscillation wavelength can be changed greatly by application of the field.

The wavelength of light emitted from the active layer can be selected to correspond to the wavelength corresponding to the lowest order of transition of electron and positive hole when no electric field is applied to the quantum well structure, with the diffraction grating being formed to achieve the desired Bragg wavelength, so as to achieve this preferred embodiment of the present invention.

The diffraction grating itself (for example, the distributed Bragg reflector) of the external waveguide part of the present invention is the same as that in conventional structure, such as described in the article by Murata et al, discussed previously.

As for the quantum well structure (for example, multiple quantum well structure) of the present invention, the individual layers are conventional; that is, each of the individual well and barrier layers have thicknesses, and are made of materials, as in conventional quantum well structure. Moreover, as in conventional quantum well structure, for example, the well layers each have barrier layers on the main surfaces thereof, such that the barrier layers sandwich the well layer. Moreover, there is no critical limitation on the number of well layers, for use in the present invention; desirably, a quantum well structure utilizing 1–50 well layers, with a total thickness of the multiple quantum well structure of up to 1 $\mu$m, can be utilized. In comparison, the multiple quantum well structure utilized in active layers of semiconductor lasers conventionally has 1–10 well layers, with a total thickness of the quantum well structure of at least 0.2 $\mu$m.

The level of voltage applied across the external waveguide part (to apply an electric field to the quantum well structure) is relatively small as compared to that applied across the active part. For illustrative purposes only, in the external waveguide part a voltage of 0.5–1.0 Voltage is applied, while in the active part a voltage of 2 V is applied. Thus, in the external waveguide part of the present invention, only a very small injected current arises, as compared to that in the active part (wherein the injected current causes light emission). For example, in the active part, the injected carrier density is $2 \times 10^{18}$ cm$^{-3}$. In the external waveguide part, the injected carrier density is 10% of that in the active part. In order to have different injected current densities in the active part and external waveguide part the active part is at least partially electrically isolated from the external waveguide part, particularly with respect to the electrodes of each part. Such isolation can be provided by providing electrical isolation between at least electrodes of the active and external regions. Such isolation can be achieved by separating the electrode over the active part from the electrode over the external waveguide part, together with providing a groove extending into the device structure between the active part and the external waveguide part. As an alternative to the groove, an ion implanted region can be provided between the active part and the external waveguide part, so as to provide the required electrical isolation. In any event, by use of such isolation, carrier injection can be achieved in the active part, while substantially avoiding such injection in the external waveguide part.

Generally, the semiconductor laser according to the present invention can be made using conventional deposition techniques, including molecular beam epitaxy (MBE) and metal organic-chemical vapor deposition (MO-CVD) for forming all layers of the device, and using conventional materials.

The active part of the device is that utilized in conventional wavelength-tunable semiconductor lasers having an external wavelength part, including such lasers having distributed Bragg reflector structure for the diffraction grating in the external waveguide part. As illustrative of the present invention, but not limiting, the active part can have a length, from the end of the device to the electrical isolation between the active and external waveguide parts (for example, to a groove utilized for such isolation) of 200–500 μm. Moreover, the length of the external waveguide part can be 200 μm –1 mm. Moreover, the thicknesses of each of the layers of the active part can be those conventionally used.

Thus, by the present invention, utilizing a quantum well structure optically coupled with the diffraction grating in the external waveguide part, with means for applying an electric field to at least the quantum well structure, a wavelength-tunable semiconductor laser is provided having an increased switching speed (to switch between different wavelengths), while also having an increased range of wavelengths.

DETAILED DESCRIPTION OF THE INVENTION

Figure 1A:
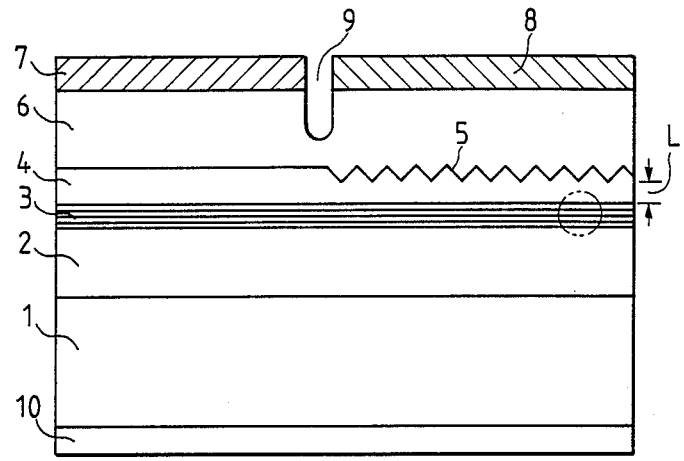
FIG. 1a is a sectional side view of one embodiment of the present invention.

While the invention will be described in connection with specific and preferred embodiments, it will be understood that it is not intended to limit the invention to those embodiments. On the contrary, it is intended to cover all alterations, modifications and equivalents as may be included within the spirit and scope of the invention as defined by the appended claims.

Generally, the present invention contemplates a wavelength-tunable semiconductor laser, having an active part and an external waveguide part, the external waveguide part having a diffraction grating such as a distributed Bragg reflector, wherein the refractive index of the external waveguide part can be varied (to thereby vary the light oscillation wavelength from the external waveguide part) by utilizing a quantum well structure optically coupled to the diffraction grating, with means for applying an electric field to the quantum well structure. By applying the electric field to the quantum well structure the refractive index of such quantum well structure, and the refractive index of the external waveguide part, is changed. Thus, by changing the refractive index of the quantum well structure, and in view of the optical coupling of the quantum well structure and the diffraction grating, the wavelength of light emitted from the active part, while in the external waveguide part, is modulated.

Thus, when a field is applied to a quantum well structure (specifically, a quantum well layer of such structure) disposed in an external waveguide part, the refractive index of the quantum well structure changes, such changes being particularly large near the quantum level energy of the quantum well structure. This change in refractive index results from the fact that the state of an exciton consisting of the electron and positive hole entrapped in the quantum well layer is extremely sensitive to the field. By changing the refractive index of the quantum well structure optically coupled with the diffraction grating, the effective refractive index of the coupled quantum well structure and diffraction grating changes, so as to change the wavelength of light in the external waveguide part.

Such change in the wavelength of light in the external waveguide part can be seen from the following. The wavelength of light Λ in the external waveguide part follows the following formula, where Λ is the period of the diffraction grating and $n_{eff}$ is the effective refractive index of the optically coupled quantum well structure and diffraction grating:

$$\lambda = 2\Lambda \times n_{eff}$$

When a voltage is applied so as to cause an electric field to be produced across the quantum well structure, $n_{eff}$ changes, thereby to change λ.

As indicated previously, an important aspect of the present invention is that the diffraction grating and quantum well structure be optically coupled. Such optical coupling is achieved when both the diffraction grating and the quantum well structure fall within the light distribution envelope in the external waveguide part. In particular, the diffraction grating and quantum well structure should be sufficiently optically coupled so that a change in refractive index of the quantum well structure provides sufficient change in refractive index of the external waveguide part. The extent (or degree) of the optical coupling will be discussed in the following paragraphs, with reference to FIG. 6.

Figure 6:
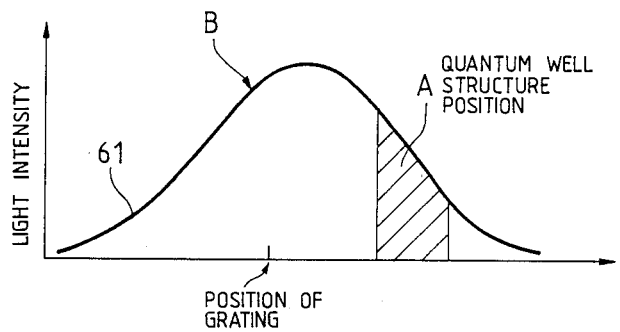
FIG. 6 illustrates the distribution of light intensity in the external waveguide part (through a plane parallel to the end of the external waveguide part) to illustrate optical coupling of the diffraction grating and quantum well structure.

Thus, FIG. 6 shows the light distribution (that is, the distribution of light intensity) in the external waveguide part with respect to the position of the diffraction grating and quantum well structure in the external waveguide part. The degree of optical coupling of the diffraction grating and the quantum well structure can be quantitatively set forth by the confinement factor of light in the quantum well structure, which is the area of the quantum well structure under the light distribution envelope 61 (area A in FIG. 6) to the total area under the light distribution envelope 61 (area B in FIG. 6). Desirably, the confinement factor for purposes of the present invention is 10%-50%. At a confinement factor of less than 10%, the coupling can be undesirably small; at a confinement factor greater than 50%, the device is difficult to manufacture.

As is clear from FIG. 6, the confinement factor is increased by providing the quantum well structure closer to the diffraction grating. The confinement factor decreases as the distance between the quantum well structure and diffraction grating increases.

When the distance is larger than the wavelength of the light emitted from the active part, the confinement factor is smaller than 1%; it is preferred that the distance between the diffraction grating and quantum well structure, measured from the closest point of approach of the diffraction grating and quantum well structure (see L in FIG. 1a) be at most equivalent to the wavelength of light emitted from the active part.

The active part of the present invention is the same as that utilized in conventional structure having an active part and external waveguide part, as in the article by Murata et al. Briefly, such active part includes an active layer, a resonant cavity (including, e.g., the active carrier injection means (such as electrodes sandwiching the active part) to inject carriers into the active layer, a resonant cavity (including, e.g., the active layer) and means to confine light (formed in the active layer) in the active layer. Specifically, such active part includes an active layer (for example, quantum well structure, including multiple quantum well structure), with cladding layers on either side of the active layer so as to confine light in the active layer, such layers being provided on a substrate, and with electrodes sandwiching the previously described structure for injecting carriers into the active layer. The active part can also be a buried heterostructure type, as is known in the art.

As indicated previously, the external waveguide part is to be electrically isolated from the active part. Such electrical isolation need not be complete electrical isolation; the requirement is that the active part and the external waveguide part be sufficiently electrically isolated so that the injected carrier density in each part is proper for such part. Again, it is emphasized that in the external waveguide part of the present invention, change in refractive index is achieved primarily through change in refractive index of the quantum well structure, not by the injected carriers as in conventional structure. The electrical isolation can be provided, for example, by providing a groove in the device structure between the active part and external waveguide part, or by providing an ion implanted region between the active and external waveguide parts, or other known techniques for providing the isolation.

It is emphasized that the carrier density in the active layer differs from the carrier density in the external waveguide part, in the present invention. For example, the carrier density in the active layer of the active part is greater than $10^{18}$ cm$^{-3}$ (it is conventionally known that a carrier density of $10^{18}$ cm$^{-3}$ is needed to cause light oscillation). On the other hand, the carrier density in the external waveguide part, including in the quantum well structure, is less than $10^{18}$ cm$^{-3}$. The different carrier densities in the active part and in the external waveguide part are achieved by utilizing different voltages for forming electric fields in the two parts, utilizing different materials in the two parts, etc.

According to the present invention, the refractive index of the quantum well structure changes, upon change in the field applied thereto, in about 100 femtoseconds. Since the switching speed is at the least 1 nsec. in conventional current injection-type lasers as described in the article by Murata et al, the laser of the present invention can change the wavelength at a remarkably higher speed than in conventional lasers.

Various specific examples of the present invention are set forth in the following. Of course, such examples are illustrative and are not limiting. These specific embodiments of the present invention will be described with reference to the accompanying drawings. In the figures illustrating the various embodiments, common structure is represented by the same reference characters.

EMBODIMENT 1

Figure 1B:
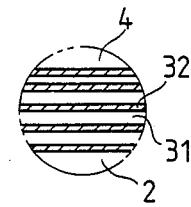
FIG. 1b is an expanded view of the multiple quantum well structure of the first embodiment of the present invention.

FIG. 1a is a sectional side view of one embodiment of the present invention, and FIG. 1b is an expanded view of the multiple quantum well structure of such embodiment (the circled structure in FIG. 1a).

An n-GaAlAs cladding layer 2, an undoped multiple quantum well active layer 3 formed by laminating alternately four layers of 100 Å-thick GaAs well layers 31 and five layers of 50 Å-thick GaAlAs barrier layers 32, and a p-GaAlAs optical guide layer 4, are grown sequentially on an n-GaAs substrate 1. Thereafter, a diffraction grating 5 with secondary order having a period of 250 nm is formed on the surface of an external waveguide part, as is known in the art. Next, after a p-GaAlAs cladding layer 6 is grown, a current injection electrode 7 and a field impression electrode 8 are formed. An insulating groove 9, so as to electrically isolate the active and external waveguide parts from each other, is then formed; thereafter, an n-type electrode 10 is formed. Finally, the active waveguide side of the laser is cleaved.

The distance between the diffraction grating 5 and quantum well structure 3, that is, distance L in FIG. 1a, is set typically in the range of 0.1-0.5 µm, and, more preferably, around 0.3 µm, to maintain sufficient confinement factor in the quantum well structure.

Each of the layers of the device can be formed by conventional molecular beam epitaxy and metal-organic chemical vapor deposition. The insulating groove 9 can be formed by conventional photolithography and etching techniques.

The oscillation wavelength of the laser thus fabricated is 850 nm with no bias applied to the field impression electrode 8, which wavelength is determined by the Bragg wavelength of the diffraction grating. The lowest quantum level of the electron-heavy positive hole of the multiple quantum well of the external waveguide (that is, the wavelength of the exciton) is 847 nm, and this value is smaller by 3 nm than the oscillation wavelength when no bias is applied to the field impression electrode. Therefore, band absorption of the laser beam by the quantum well of the external waveguide region is relatively (sufficiently) small, and the external waveguide region has a low loss.

When a −2 V negative bias is applied to the field impression electrode 8, the oscillation wavelength becomes 842 nm and is shorter by 8 nm than when no bias is applied. Thus, when an electric field is applied to the quantum well structure, the lowest quantum level between the electron and the heavy positive hole (that is, an equivalent forbidden band width) becomes small, with a result being in a drop in the refractive index, and a corresponding reduction of the Bragg wavelength, of the diffraction grating. The oscillation wavelength changes continuously between 850 nm and 842 nm when the magnitude of the negative bias to the field impression electrode is changed. The oscillation spectrum keeps a longitudinal single mode within this range. Furthermore, the switching time of the oscillation wavelength due to the field impression is about 200 psec., which is remarkably shorter than that of a conventional current injection-type laser. Since this switching time is essentially determined by the capacity (approximately 1 pf) of the field impression electrode 8, it is possible to obtain a wavelength-tunable laser operating at a high speed, by reducing the capacity.

EMBODIMENT 2

Figure 2A:
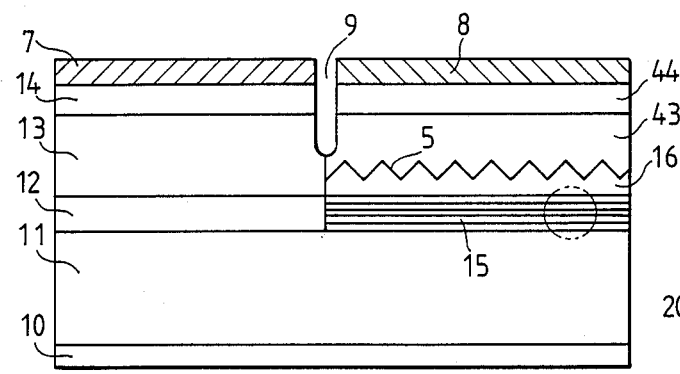
FIG. 2a is a sectional view of a second embodiment of the present invention.
Figure 2B:
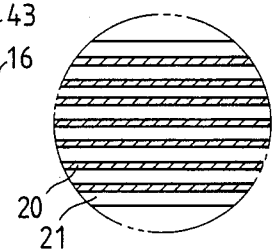
FIG. 2b is an expanded view of the multiple quantum well structure of the second embodiment of the present invention.

FIG. 2a is a sectional side view of a second embodiment of the present invention, and FIG. 2b is an expanded view of the multiple quantum well structure utilized in such second embodiment (the circled structure in FIG. 2a).

An InGaAsP active layer (wavelength of approximately 1.5 $\mu$m) 12, a p-InP cladding layer 13 and a p-InGaAsP layer 14 are sequentially formed, in a stack, on an n-InP substrate 11. Such layers can be formed by molecular beam epitaxy or metal organic-chemical vapor deposition, deposition processes known in the art. After forming such layers, these layers (at the location of the external waveguide part) are removed by etching. Such etching can be performed by dry or wet etching, as known in the art.

Thereafter, after removal of layers 12, 13 and 14 at the location of the external waveguide part, an undoped multiple quantum well structure 15 is formed at the location of the external waveguide part, by laminating alternately eight layers of 125 Å-thick InGaAs well layers 20 and seven layers of 100 Å-thick InP barrier layers 21; such multiple quantum well structure 15 can be formed by known metal organic-chemical vapor deposition techniques. Thereafter, a p-InGaAsP optical guide layer 16 is formed, by conventional metal organic-chemical vapor deposition, for example, and thereafter a diffraction grating having a period of 230 nm is formed on the surface of the p-InGaAsP optical guide layer, by known techniques. A p-InP cladding layer 43 and a p-InGaAsP layer 44 are then grown on the diffraction grating, by conventional liquid phase epitaxy or by metal organicchemical vapor deposition, for example. Thereafter, a current injection electrode 7 and a field impression electrode 8 are formed; an insulating groove 9 is formed to electrically separate the active and external waveguide parts, and then an n-electrode 10 is formed. As seen in Fig. 2a, the insulating groove 9 extends to the diffraction grating. The insulating groove 9 can be formed by conventional photolithography and etching.

The distance between the diffraction grating and quantum well structure, that is, the distance corresponding to distance L in FIG. 1a, is set typically in the range of 0.1–0.7 $\mu$m, and, more preferably, 0.2–0.3 $\mu$m, to maintain sufficient confinement factor in the quantum well structure.

The current injection electrode 7 and field impression electrode 8 can be formed directly on the p-InGaAsP layers 14 and 44, respectively,; such electrodes can be formed, for example, by vapor deposition. Such electrodes can be formed of gold, for example, with a thickness of about 1 $\mu$m. Alternatively, a thin layer of metal (for example, chromium or platinum or titanium or molybdenum) can be provided between the semiconductor layer 14 or 44 and the gold, so as to improve adhesion.

Field impression dependence of the oscillation wavelength of the laser device thus fabricated is substantially similar to that in the first embodiment of the present invention. The oscillation wavelength is 1.531 $\mu$m when no bias is applied to the field impression electrode 8, and is 1.523 $\mu$m and 1.517 $\mu$m when $-1$ V and $-2$ V are applied, respectively. The oscillation wavelength changes continuously when the impressed voltage is changed. The switching time of the wavelength is from 100 to 200 psec., and the laser exhibits a high switching speed.

EMBODIMENT 3

Figure 3A:
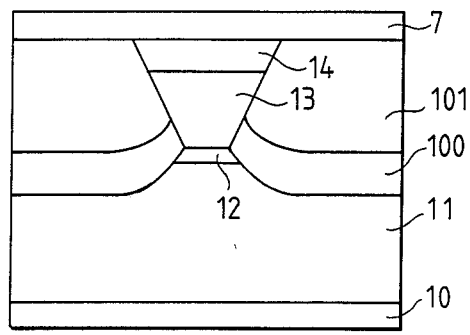
FIGS. 3a and 3b are end views of a third embodiment of the present invention, with FIG. 3a showing an end view of the active part, and FIG. 3b showing an end view of the external waveguide part.
Figure 3B:
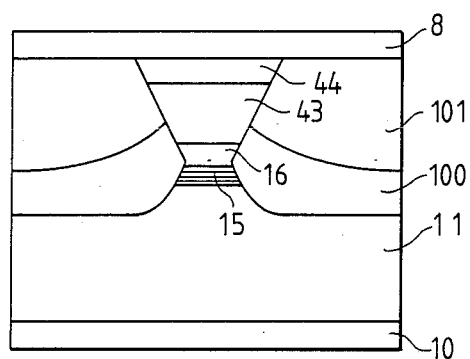

With reference to FIGS. 3a and 3b, the third embodiment illustrates the present invention utilized in a buried heterostructure device. Thus, FIG. 3a shows an end view of the active part of the semiconductor device, while FIG. 3b shows the external waveguide part of the laser device.

In forming the laser structure shown in FIGS. 3a and 3b, layers 12–16, 43 and 44 are formed in the same manner as described in connection with the second embodiment of the present invention. Thereafter, utilizing conventional photoresist and conventional etching techniques, layers 12–16, 43 and 44 are etched so as to make stripe regions in both the active part and external waveguide part. Etching, as conventional in the manufacture of buried heterostructures, is utilized in this embodiment. In the present embodiment, the active layer 12, as well as the multiple quantum well structure 15, are etched completely through. Thus, stripe regions of both the active layer 12 and multiple quantum well structure 15, having widths (of each) of 0.5–2.0 $\mu$m, are formed. Thereafter, the active layer and multiple quantum well structure are buried with an p-InP burying layer 100 and with an n-InP layer 101 stacked on each other. The p-n junction between layers 100 and 101 forces all injected carriers to go into the active layer, as is conventional in buried heterostructure layers. Thereafter, electrodes 7, 8 and 10 are formed.

The distance between the diffraction grating and the quantum well structure in the present embodiment, corresponding to distance L in FIG. 1a, is the same as that set forth previously with respect to Embodiment 2.

As an example, in the buried heterostructure laser of the present embodiment, a laser having a longitudinal single mode oscillation, with a threshold current of 5–10 mA, is achieved.

EMBODIMENT 4

Figure 4:
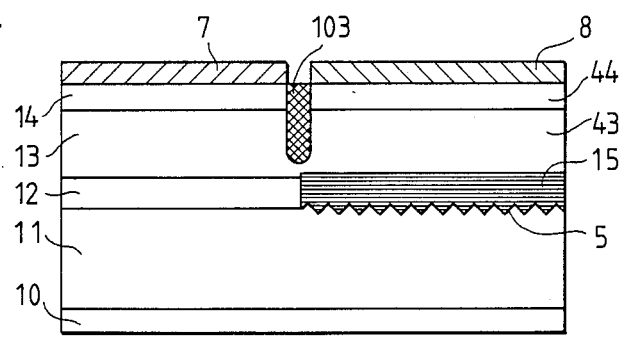
FIG. 4 is a sectional view of a fourth embodiment of the present invention, wherein the multiple quantum well structure is provided directly on the diffraction grating.

FIG. 4 is a sectional view showing a fourth embodiment of the present invention. This FIG. 4 embodiment provides the diffraction grating beneath the multiple quantum well structure, and utilizes an ion implanted region as the isolation region of the device. To form the embodiment of FIG. 4, layers 12–14 are formed on substrate 11; thereafter, these layers 12–14 are removed (for example, by conventional etching) in the external waveguide part. Then, a diffraction grating 5 is formed in the top surface of substrate 11, by conventional means. Then, the multiple quantum well structure 15 is formed directly on the diffraction grating, on the surfaces of substrate 11. Thereafter, clad layer 43 and p-type layer 44 (for example, p-InGaAsP layer) are formed on the multiple quantum well structure, as shown in FIG. 4. Then, the ion implanted region 103 is provided between the active part and external waveguide part (for example, a mask layer is provided and then ion implantation is performed); the technique for forming ion implanted region 103 is a conventional ion implantation method, utilized in ion implantation techniques for forming isolation regions. After forming the ion-implanted isolation layer, electrodes 7, 8 and 10 are formed as in the previous embodiments.

This Embodiment 4, together with the other embodiments, shows that, according to the present invention, a multiple quantum well structure can be formed over or under the grating, in the external waveguide part; the important factor is that the quantum well structure and the grating are optically coupled, and that an electric field is applied to the quantum well structure, as discussed previously. Thus, the quantum well structure can be formed directly in contact with the diffraction grating, or can be spaced therefrom, as long as optical coupling is achieved.

Figure 5:
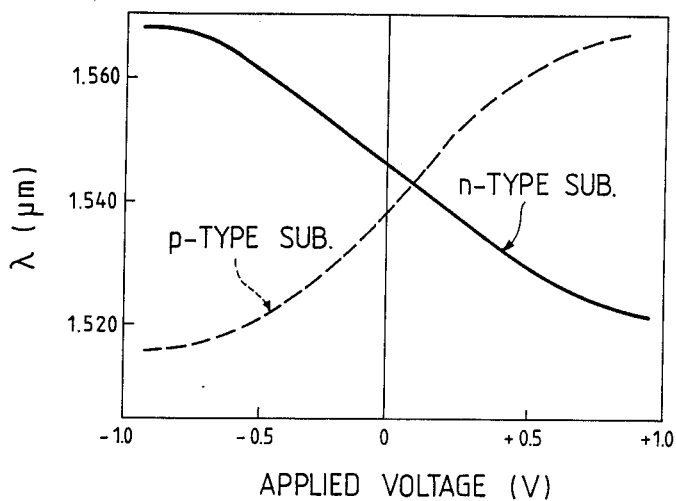
FIG. 5 illustrates the variation in the wavelength in the external waveguide part, based upon varying the applied voltage to the electrodes of the external waveguide part, where the substrate is p-type or n-type.

FIG. 5 shows the effect, of a change in the voltage applied to the electrodes for forming the electric field in the external waveguide part, on the wavelength of light in the external waveguide part; this FIG. 5 illustrates that the direction of wavelength change is dependent on the conductivity type of the substrate of the laser device. Thus FIG. 5 shows the wavelength of light in the external waveguide part as a function of the voltage applied to the top electrode 8 as shown in the embodiments in FIGS. 1-4. When an n-type substrate is utilized, $\lambda$ decreases as the applied voltage increases. On the contrary, $\lambda$ increases as the applied voltage increases, in the case of a p-type substrate.

Accordingly, there can be obtained, utilizing the present invention, a wavelength-tunable semiconductor laser having a range of wavelengths as great as, for example, about 100 Å, which wavelength-tunable semiconductor laser is capable of switching at a high speed. Such a wavelength-tunable semiconductor laser can be substituted for known wavelength-tunable semiconductor lasers in coherent optical communication systems.

While we have shown and described several embodiments in accordance with the present invention, it is understood that the same is not limited thereto, but is susceptible of numerous changes and modifications as known to those skilled in the art. Therefore, we do not wish to be limited to the details shown and described herein, but intend to cover all such changes and modifications as are encompassed by the scope of the appended claims.

What is claimed:

1. In a wavelength-tunable semiconductor laser comprising an active part having an active layer, and an external waveguide part having a diffraction grating, the improvement comprising wherein the external waveguide part includes a quantum well structure with at least one quantum well layer in addition to said diffraction grating, the quantum well structure being optically coupled to the diffraction grating, the external waveguide part including means for applying an electric field to the quantum well structure.

2. A wavelength-tunable semiconductor laser according to claim 1, wherein the diffraction grating is a distributed Bragg reflector.

3. A wavelength-tunable semiconductor laser according to claim 1, wherein light emitted from said active layer is distributed in the external waveguide part with a distribution of light intensity, and wherein the quantum well structure is positioned, relative to the diffraction grating, such that both the diffraction grating and quantum well structure fall within the distribution of the light, so as to provide the optical coupling of the quantum well structure and diffraction grating.

4. A wavelength-tunable semiconductor laser according to claim 3, wherein said means for applying an electric field includes an electrode located on the external waveguide part.

5. A wavelength-tunable semiconductor laser according to claim 3, wherein the quantum well structure includes at least one well layer and barrier layers at each side of each of the at least one well layer.

6. A wavelength-tunable semiconductor laser according to claim 5, wherein the quantum well structure includes a plurality of well layers.

7. A wavelength-tunable semiconductor laser according to claim 1, wherein the active part and external waveguide part are electrically isolated from each other by insulating means.

8. A wavelength-tunable semiconductor laser according to claim 7, wherein said insulating means is a groove provided between the active part and the external waveguide part.

9. A wavelength-tunable semiconductor laser according to claim 7, wherein said insulating means is an ion-implanted region provided between the active part and the external waveguide part.

10. A wavelength-tunable semiconductor laser according to claim 1, wherein the external waveguide part has a length, extending from an end thereof adjacent the active part to an opposite end, of 200 $\mu$m-1 mm.

11. A wavelength-tunable semiconductor laser according to claim 1, wherein the diffraction grating has a Bragg wavelength, when no electric field is applied to the external waveguide part, that is within 100 Å of the wavelength corresponding to the quantum level energy of the lowest order of transition of electron and hole when no electric field is applied to the quantum well strurcture.

12. A wavelength-tunable semiconductor laser according to claim 1, wherein each of the active part and external waveguide part have buried heterostructure, the active layer and quantum well structure each being in the form of a stripe in the buried heterostructure.

13. A wavelength-tunable semiconductor laser according to claim 1, wherein light emitted from the active part has a wavelength $\lambda$, and the quantum well structure is spaced from the diffraction grating by a distance less than $\lambda$.

14. A wavelength-tunable semiconductor laser according to claim 1, wherein the diffraction grating and quantum well structure are optically coupled such that the confinement factor in the quantum well structure is at least 1%.

15. A wavelength-tunable semiconductor laser according to claim 1, wherein the confinement factor is 10%-50%.

16. A wavelength-tunable semiconductor laser comprising an active part, and an external waveguide part having a diffraction grating; the active part including a substrate having an active layer thereon, means for confining light in the active layer, a resonant cavity, and an electrode for injecting carriers into the active layer; the external waveguide part including a quantum well structure with at least one quantum well layer in addition to said diffraction grating, the quantum well structure being optically coupled to the diffraction grating, the external waveguide part including means for applying an electic field to the quantum well structure.

17. A wavelength-tunable semiconductor laser according to claim 16, wherein the diffraction grating is a distributed Bragg reflector.

18. A wavelength-tunable semiconductor laser according to claim 16, wherein light emitted from said active layer is distributed in the external waveguide part with a distribution of light intensity, and wherein the quantum well structure is positioned, relative to the diffraction grating, such that both the diffraction grating and quantum well structure fall within the distribution of the light, so as to provide the optical coupling of the quantum well structure and diffraction grating.

19. A wavelength-tunable semiconductor laser according to claim 16, wherein the active part and external waveguide part are electrically isolated from each other by insulating means.

20. A wavelength-tunable semiconductor laser according to claim 16, wherein the diffraction grating has a Bragg wavelength, when no electric field is applied to the external waveguide part, that is within 100 Å of the wavelength coresponding to the quantum level energy of the lowest order of transition of electron and hole when no electric field is applied to the quantum well structure.

21. A wavelength-tunable semiconductor laser according to claim 16, wherein the resonant cavity includes the active layer.

* * * * *